United States Patent
Dai et al.

(10) Patent No.: US 10,922,789 B2
(45) Date of Patent: Feb. 16, 2021

(54) SUPER-RESOLUTION LATTICE LIGHT FIELD MICROSCOPIC IMAGING SYSTEM AND METHOD

(71) Applicant: TSINGHUA UNIVERSITY, Beijing (CN)

(72) Inventors: Qionghai Dai, Beijing (CN); Zhi Lu, Beijing (CN); Jiamin Wu, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 58 days.

(21) Appl. No.: 16/357,850

(22) Filed: Mar. 19, 2019

(65) Prior Publication Data
US 2020/0242735 A1    Jul. 30, 2020

(30) Foreign Application Priority Data
Jan. 30, 2019    (CN) .......................... 2019 1 0094197

(51) Int. Cl.
*G06T 3/40* (2006.01)
*G02B 21/00* (2006.01)
(Continued)

(52) U.S. Cl.
CPC ........ *G06T 3/4053* (2013.01); *G02B 21/0052* (2013.01); *G02B 26/101* (2013.01); *G02B 26/12* (2013.01); *H01L 27/14625* (2013.01)

(58) Field of Classification Search
CPC combination set(s) only.
See application file for complete search history.

(56) References Cited

U.S. PATENT DOCUMENTS

| 6,248,988 B1* | 6/2001 | Krantz | G02B 21/004 |
| | | | 250/201.3 |
| 2007/0052958 A1* | 3/2007 | Ulrich | G02B 21/02 |
| | | | 356/318 |

(Continued)

FOREIGN PATENT DOCUMENTS

| CN | 107091825 A | 8/2017 |
| CN | 107678154 A | 2/2018 |

OTHER PUBLICATIONS

Office Action dated Jan. 20, 2020 for corresponding CN Application No. 201910094197.2 and its English translation.

*Primary Examiner* — Tsung Yin Tsai
(74) *Attorney, Agent, or Firm* — David D. Brush; Westman, Champlin & Koehler, P.A (57) ABSTRACT

A super-resolution lattice light field microscopic imaging system includes: a microscope configured to magnify a sample and image the sample onto a first image plane of the microscope; a first relay lens configured to match a numerical aperture of an objective with that of a microlens array; a 2D scanning galvo configured to rotate an angle of a light path in the frequency domain plane; an illuminating system configured to provide uniform illumination on the microlens array to generate SIM pattern illumination; the microlens array, configured to modulate a light beam with a preset angle to a target spatial position at a back focal plane of the microlens array to obtain a modulated image; an image sensor configured to record the modulated image; and a reconstruction module configured to reconstruct a 3D structure of the sample based on the modulated image.

20 Claims, 2 Drawing Sheets

(51) Int. Cl.
*G02B 26/10* (2006.01)
*G02B 26/12* (2006.01)
*H01L 27/146* (2006.01)

(56) References Cited

U.S. PATENT DOCUMENTS

| | | | | |
|---|---|---|---|---|
| 2014/0146376 | A1* | 5/2014 | Kleppe | G02B 21/0072 |
| | | | | 359/212.1 |
| 2015/0192461 | A1* | 7/2015 | Chen | G01J 1/0403 |
| | | | | 356/366 |
| 2015/0260978 | A1* | 9/2015 | Cremer | G02B 21/06 |
| | | | | 348/79 |
| 2016/0327779 | A1* | 11/2016 | Hillman | G02B 23/04 |
| 2017/0031151 | A1* | 2/2017 | Cogswell | H04N 5/2256 |
| 2018/0210187 | A1* | 7/2018 | Dai | G02B 21/0004 |
| 2020/0241274 | A1* | 7/2020 | Dai | G02B 21/361 |

\* cited by examiner

SUPER-RESOLUTION LATTICE LIGHT FIELD MICROSCOPIC IMAGING SYSTEM AND METHOD

CROSS-REFERENCE TO RELATED APPLICATION

This application claims priority to and benefits of Chinese Patent Application Serial No. 201910094197.2, filed with the State Intellectual Property Office of P. R. China on Jan. 30, 2019, the entire content of which is incorporated herein by reference.

FIELD

The present disclosure relates to the field of computational optical microscopy, and more particularly to a super-resolution lattice light field microscopic imaging system and method.

BACKGROUND

A resolution of an optical microscopy is limited to a diffraction limit resolution, which depends on a wavelength. 3D (three-dimensional) imaging of a sample is important for biological researches. However, only a 2D (two-dimensional) image is captured by a camera at a time. In order to speed up the 3D imaging, researchers have developed a light field microscopy, which is a simultaneous 3D imaging technology, and may capture a light field of a fixed biological sample by appending a microlens array to an image plane of a conventional fluorescence microscope. However, the light field splits its optical frequency domain to small blocks, which sacrifices a spatial resolution to improve an angle resolution.

SUMMARY

Embodiments of the present disclosure seek to solve at least one of the problems existing in the related art to at least some extent.

According to a first aspect of embodiments of the present disclosure, there is provided a super-resolution lattice light field microscopic imaging system, including: a microscope, including an objective and a tube lens, and configured to magnify a sample and image the sample onto a first image plane of the microscope; a first relay lens, configured to match a numerical aperture of the objective with that of a microlens array and to magnify or minify the first image plane; a 2D scanning galvo, disposed in a frequency domain plane of the first relay lens, and configured to rotate an angle of a light path in the frequency domain plane; an illuminating system, configured to provide uniform illumination on the microlens array to generate structured illumination microscopy (SIM) pattern illumination; the microlens array, configured to modulate a light beam with a preset angle to a target spatial position at a back focal plane of the microlens array to obtain a modulated image; an image sensor, disposed at a second image plane of an imaging camera lens and coupled with the microlens array through the imaging camera lens, and configured to record the modulated image; and a reconstruction module, configured to acquire the modulated image from the image sensor and reconstruct a 3D structure of the sample based on the modulated image.

According to a second aspect of embodiments of the present disclosure, there is provided a super-resolution lattice light field microscopic imaging method, including: generating SIM pattern illumination on a sample using a laser source and a dichroic mirror; magnifying the sample by a microscope and imaging the sample onto a first image plane of the microscope; matching a numerical aperture of an objective with that of a microlens array and magnifying or minifying the first image plane through a first relay lens; rotating an angle of a light path in a frequency domain plane through a 2D scanning galvo; modulating a light beam with a preset angle to a target spatial position at a back focal plane of the microlens array through a microlens array to obtain a modulated image; recording the modulated image by an image sensor; and reconstructing a 3D structure of the sample by a reconstruction module based on the modulated image.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the drawings, in which.

DETAILED DESCRIPTION

Reference will now be made in detail to exemplary embodiments, examples of which are illustrated in the accompanying drawings, wherein the same or similar elements and the elements having same or similar functions are denoted by like reference numerals throughout the descriptions. Embodiments described herein with reference to drawings are explanatory and used to generally understand the present disclosure, and shall not be construed to limit the present disclosure.

According to a first aspect of embodiments of the present disclosure, there is provided a super-resolution lattice light field microscopic imaging system, including: a microscope, including an objective and a tube lens, and configured to magnify a sample and to image the sample onto a first image plane of the microscope; a first relay lens, configured to match a numerical aperture of the objective with that of a microlens array and to magnify or minify the first image plane; a 2D scanning galvo, disposed in a frequency domain plane of the first relay lens, and configured to rotate an angle of a light path in the frequency domain plane; an illuminating system, configured to provide uniform illumination on the microlens array to generate SIM pattern illumination; the microlens array, configured to modulate a light beam with a preset angle to a target spatial position at a back focal plane of the microlens array to obtain a modulated image; an image sensor, disposed at a second image plane of an imaging camera lens and coupled with the microlens array through the imaging camera lens, and configured to record the modulated image; and a reconstruction module, configured to acquire the modulated image from the image sensor and reconstruct a 3D structure of the sample based on the modulated image.

In the super-resolution lattice light field microscopic imaging system according to embodiments of the present disclosure, the 2D scanning galvo is arranged in front of the microlens array to shift sub-pixels of the microlens array, the illuminating system is arranged behind the microlens array to allow the illuminating laser to pass the same microlens array to generate the SIM pattern illumination, and an ordinary computer is incorporated to perform data processing, thereby achieving super-resolution light field imaging. The super-resolution lattice light field microscopic imaging system according to embodiments of the present disclosure combines the super-resolution of a structured illumination microscopy (SIM) and the fast 3D imaging of a light field microscope. Moreover, the super-resolution lattice light field microscopic imaging system according to embodiments of the present disclosure has a simple structure, a fast imaging speed and an excellent imaging quality, and is suitable for observing dynamic behaviors and structure of a biological sample.

In an embodiment of the present disclosure, the illuminating system includes: a laser source, disposed outside the microscope, and configured to provide stable and uniform illumination; a laser filter, configured to eliminate interference from a stray light; and a dichroic mirror, disposed between the microlens array and the image sensor, configured to distinguish an illumination beam from an imaging beam and direct the illumination beam onto the microlens array to generate the SIM pattern illumination.

In an embodiment of the present disclosure, the tube lens is configured to match and correct a magnification of the objective.

In an embodiment of the present disclosure, the 2D scanning galvo includes an X-direction scanning galvo and a Y-direction scanning galvo, with the frequency domain plane as a coordinate system.

In an embodiment of the present disclosure, the 2D scanning galvo is further configured to rotate a light beam along an x-axis direction through the X-direction scanning galvo and rotate a light beam along a y-axis direction through the Y-direction scanning galvo.

In an embodiment of the present disclosure, the first relay lens includes a first lens and a second lens, when the first image plane is located at a front focal plane of the first lens, the magnified or minified first image plane is located at a back focal plane of the second lens.

In an embodiment of the present disclosure, a magnification or minification of the first relay lens is determined by a ratio of a focal length of the first lens to a focal length of the second lens.

In an embodiment of the present disclosure, the image sensor is selected from a Scientific Complementary Metal-Oxide-Semiconductor Transistor sCMOS monochrome sensor or Charge Coupled Device CCD, or a Complementary Metal-Oxide-Semiconductor Transistor CMOS.

In an embodiment of the present disclosure, the super-resolution lattice light field microscopic imaging system further includes a controlling system, configured to simultaneously trigger the 2D scanning galvo and the image sensor.

According to a second aspect of embodiments of the present disclosure, there is provided a super-resolution lattice light field microscopic imaging method, including: generating SIM pattern illumination on a sample using a laser source and a dichroic mirror; magnifying the sample by a microscope and imaging the sample onto a first image plane of the microscope; matching a numerical aperture of an objective with that of a microlens array and magnifying or minifying the first image plane through a first relay lens; rotating an angle of a light path in a frequency domain plane through a 2D scanning galvo; modulating a light beam with a preset angle to a target spatial position at a back focal plane of the microlens array through a microlens array to obtain a modulated image; recording the modulated image by an image sensor; and reconstructing a 3D structure of the sample by a reconstruction module based on the modulated image.

The super-resolution lattice light field microscopic imaging method according to embodiments of the present disclosure is realized by arranging the 2D scanning galvo in front of the microlens array to shift sub-pixels of the microlens array, arranging an illuminating system behind the microlens array to allow the illuminating laser to pass the same microlens array to generate the SIM pattern illumination, and incorporating an ordinary computer to perform data processing. The super-resolution lattice light field microscopic imaging method according to embodiments of the present disclosure combines the super-resolution of an SIM and the fast 3D imaging of a light field microscope, and thus achieves the super-resolution light field imaging. Moreover, the super-resolution lattice light field microscopic imaging method according to embodiments of the present disclosure may be implemented by a simple imaging system, has a fast imaging speed and an excellent imaging quality, and is suitable for observing dynamic behaviors and structure of a biological sample.

In the following, the super-resolution lattice light field microscopic imaging system and method according to embodiments of the present disclosure will be described in detail with reference to drawings.

Figure 1:
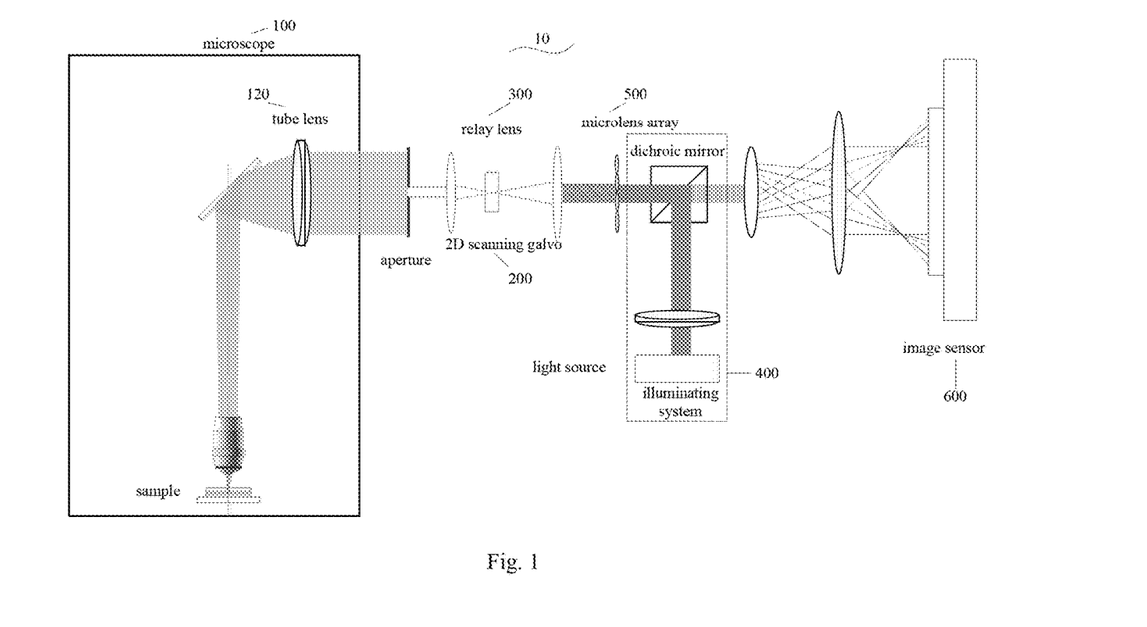
FIG. 1 is a schematic diagram of a super-resolution lattice light field microscopic imaging system according to an embodiment of the present disclosure.

FIG. 1 is a schematic diagram of a super-resolution lattice light field microscopic imaging system according to an embodiment of the present disclosure.

As illustrated in FIG. 1, the super-resolution lattice light field microscopic imaging system 10 includes: a microscope 100, a 2D scanning galvo 200, a first relay lens 300, an illuminating system 400, a microlens array 500, an image sensor 600 and a reconstruction module 700 (not shown in FIG. 1).

The microscope 100 includes an objective 110 (not shown in FIG. 1) and a tube lens 120, and is configured to magnify a sample and to image the sample onto a first image plane of the microscope. In an embodiment of the present disclosure, the tube lens 120 is configured to match and correct a magnification of the objective 110. The first relay lens 300 is configured to match a numerical aperture of the objective 110 with that of the microlens array 500 and to magnify or minify the first image plane. The 2D scanning galvo 200 is disposed in a frequency domain plane of the first relay lens 300, and configured to rotate an angle of a light path in the frequency domain plane. The illuminating system 400 is configured to provide uniform illumination on the microlens array to generate SIM pattern illumination. The microlens array 500 is configured to modulate a light beam with a preset angle to a target spatial position at a back focal plane of the microlens array 500 to obtain a modulated image. The image sensor 600 is disposed at a second image plane of an imaging camera lens and coupled with the microlens array 500 through the imaging camera lens, and configured to record the modulated image. The reconstruction module 700 is configured to acquire the modulated image from the image sensor 600 and reconstruct a 3D structure of the sample based on the modulated image. The super-resolution lattice light field microscopic imaging system 10 according to embodiments of the present disclosure may obtain a high-resolution Wigner distribution function (WDF) by shifting the light field with sub-pixels and achieve super-resolution imaging because of the SIM illumination. Moreover, the super-resolution lattice light field microscopic imaging system 10 has a simple structure, a fast imaging speed and an excellent imaging quality, and is suitable for observing dynamic behaviors and structure of a biological sample.

It will be appreciated that, the super-resolution lattice light field microscopic imaging system 10 according to embodiments of the present disclosure includes: the microscope 100; the microlens array 500; the illuminating system 400 configured to provide the uniform illumination on the microlens array to generate the SIM pattern illumination; the 2D scanning galvo 200 configured to shift sub-pixel on a spatial plane; the image sensor 600 disposed at the back focal plane of the microlens array 500 and configured to record an image corresponding to an modulated light beam. It will be understood that a WDF obtained by a traditionally light field is considered to be low-resolution. Taking advantage of the sub-pixel shift of the light field, the high-resolution WDF may be obtained by embodiments of the present disclosure. Due to the SIM illumination, embodiments of the present disclosure may achieve the super-resolution imaging. Moreover, the super-resolution lattice light field microscopic imaging system of the present disclosure has a simple structure, a fast imaging speed and an excellent imaging quality, and is suitable for observing dynamic behaviors and structure of a biological sample.

It should be illustrated that, the microscope 100 may be a wide-field microscope or a wide-field fluorescence microscope, which may be selected as required and will not be specifically limited herein. A fluorescence image subjected to the SIM pattern illumination and the sub-pixel shift is modulated by the microlens array 500 in a super-resolution. The SIM pattern illumination is formed by providing uniform illumination through the microlens array 500 or some specific gratings. The super-resolution lattice light field microscopic imaging system 10 is configured to scan angles on the frequency domain plane or shift spatial positions on the image plane.

Specifically, the microscope 100 is configured to magnify a sample and image the sample onto the image plane of the microscope so as to output from an output port of the image plane. The 2D scanning galvo 200 rotates the angle of the light path in the frequency domain plane, equivalent to horizontal movement on the spatial plane, achieving the sub-pixel shift. The microlens array 500 is configured to modulate light beams with different angles to different spatial positions at the back focal plane of the microlens array 500, respectively, so as to obtain a plurality of modulated images. The image sensor 600 is disposed at an image plane of the imaging camera lens, and configured to record images corresponding to the modulated light beams at the back focal plane of the microlens array 500.

In an embodiment of the present disclosure, the super-resolution lattice light field microscopic imaging system 10 may further include a second relay lens between the illuminating system 400 and the image sensor 600. The image sensor 600 is disposed at an image plane of the second relay lens and configured to record the images corresponding to the modulated beams at the back focal plane of the microlens array 500.

In order to make embodiments of the present disclosure easier to understand, the super-resolution lattice light field microscopic imaging system according to embodiments of the present disclosure will be further described with reference to FIG. 2.

It will be appreciated that, the microscope 100 is configured to magnify a sample (such as a microscopic biological sample) and image the sample onto the image plane of the microscope so as to output from the output port of the image plane. In an embodiment, the microscope 100 is mounted on a wide-field fluorescence microscope, and may realize primary magnification of the sample. Further, the microscope 100 may output an image plane of the sample through the output port for further processing at a posterior stage.

Further, in an embodiment of the present disclosure, the 2D scanning galvo 200 includes an X-direction scanning galvo and a Y-direction scanning galvo (not shown in FIG. 2), with the frequency domain plane as a coordinate system.

In an embodiment of the present disclosure, the 2D scanning galvo 200 is further configured to rotate a light beam along an x-axis direction through the X-direction scanning galvo and rotate a light beam along a y-axis direction through the Y-direction scanning galvo.

It will be appreciated that, the first relay lens 300 and the 2D scanning galvo 200 may constitute a 2D scanning system. The 2D scanning system may be driven by a specific voltage, and is configured to rotate the angle of the light path in the frequency domain plane, equivalent to horizontal movement on the spatial plane. The 2D scanning system 200 includes a special power supply. The 2D scanning galvo is disposed in the frequency domain plane. In an embodiment, 2D scanning galvo may include a mirror capable of rotating along the x-axis and the y-axis, respectively.

In embodiments of the present disclosure, the first relay lens 300 is configured to match the numerical aperture of the objective 110 with that of the microlens array 500. The first relay lens is designed for a specific magnification, and formed as a 4f system including a primary lens and a secondary lens. A back focal plane of the primary lens coincides with a front focal plane of the secondary lens. When an image plane of an imaging optical path is located at a front focal plane of the primary lens, a magnified or minified image plane will be located at a back focal plane of the secondary lens. A magnification or minification of the first relay lens is determined by a ratio of a focal length of the primary lens to a focal length of the secondary lens.

Specifically, in an embodiment of the present disclosure, the first relay lens 300 includes a first lens 310 and a second lens 320. When the first image plane is located at a front focal plane of the first lens 310, the magnified or minified first image plane is located at a back focal plane of the second lens 320.

In an embodiment of the present disclosure, a magnification or minification of the first relay lens is determined by a ratio of a focal length of the first lens 310 to a focal length of the second lens 320.

It should be illustrated that, the first lens 310 may be referred to as the primary lens, and the second lens 320 may be referred to as the secondary lens.

The microlens array 500 with a short focal length is disposed at an image plane of the first relay lens and is configured to modulate the light beams at different angles. Information corresponding to different angles is modulated to different spatial positions of the sensor via the microlens array 500, thereby achieving simultaneous imaging at different angles.

In an embodiment of the present disclosure, the image sensor 600 may be, for example, a Scientific Complementary Metal-Oxide-Semiconductor Transistor sCMOS monochrome sensor or Charge Coupled Device CCD a Complementary Metal-Oxide-Semiconductor Transistor CMOS, or other types of image sensors, which will not be specifically limited herein.

Specifically, the image sensor 600 is disposed at the image plane of the imaging camera lens or at the image plane of the second relay lens, and configured to record the images corresponding to the modulated beams at the back focal plane of the microlens array. That is, the image sensor 600 is coupled with the microlens array 500 through the imaging camera lens, and configured to simultaneously image all the light beams modulated by a prior stage.

Further, in an embodiment of the present disclosure, the illuminating system 400 includes a laser source 410, a laser filter 420 and a dichroic mirror 430.

The laser source 410 is disposed outside the microscope 100, and configured to provide stable and uniform illumination. The laser filter 420 is configured to eliminate interference from a stray light. The dichroic mirror 430 is disposed between the microlens array 500 and the image sensor 600, and configured to distinguish an illumination beam from an imaging beam and direct the illumination beam onto the microlens array to generate the SIM pattern illumination.

Figure 3:
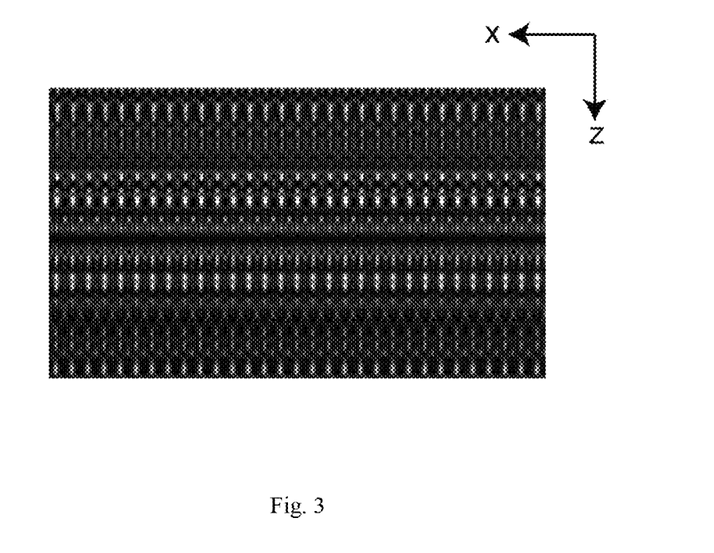
FIG. 3 is a sectional view in an x-z direction of an SIM illumination pattern generated by a microlens array according to embodiments of the present disclosure.

In an embodiment of the present disclosure, the illumination system 400 is configured to provide the SIM illumination pattern (its sectional view in an x-z direction as shown in FIG. 3) under the cooperation of the microlens array 500.

In an embodiment of the present disclosure, the illumination system 400 consists of the laser source 410, the laser filter 420 and the dichroic mirror 430.

In an embodiment of the present disclosure, the laser source 410 may be a sapphire laser, or other types of laser sources.

In an embodiment of the present disclosure, a mercury lamp may be used as a light source of the illumination system 400.

In an embodiment of the present disclosure, the laser filter 420 is disposed between the laser source 410 and the dichroic mirror 430, and configured to eliminate interference from other stray lights.

In an embodiment of the present disclosure, the dichroic mirror 430 is disposed between the microlens array 500 and the camera 600, and configured to distinguish the illumination beam from the imaging beam and direct the uniform illumination onto the microlens array 500 to generate the SIM pattern illumination.

Further, in an embodiment of the present disclosure, the super-resolution lattice light field microscopic imaging system 10 further includes a controlling system 800 configured to simultaneously trigger the 2D scanning galvo 200 and the image sensor 600.

Figure 2:
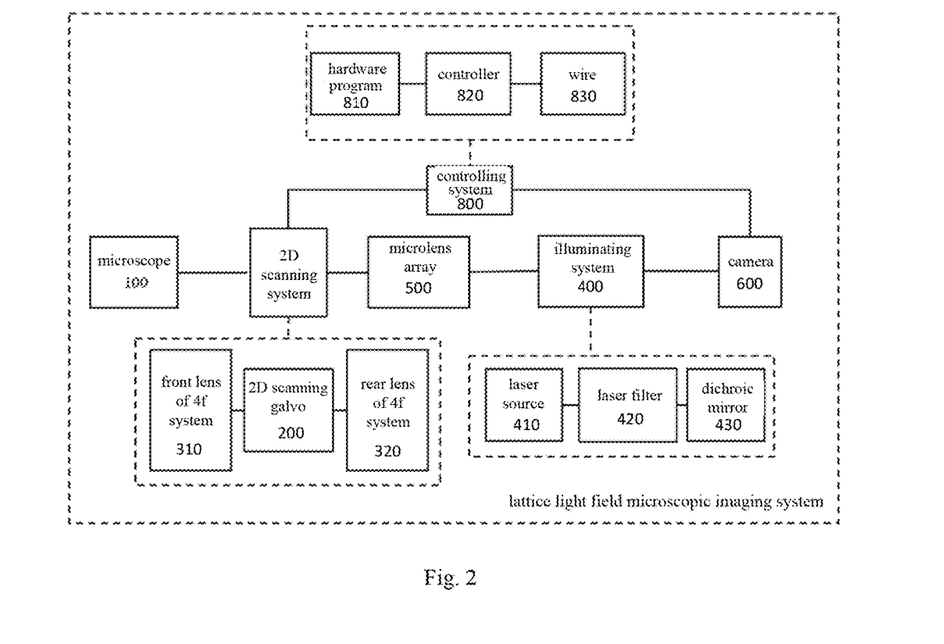
FIG. 2 is a block diagram of a super-resolution lattice light field microscopic imaging system according to an embodiment of the present disclosure.

As shown in FIG. 2, the controlling system 800 connects the 2D scanning system with the camera 600, which ensures the simultaneous trigger of the 2D canning system and the camera 600.

In an embodiment of the present disclosure, the controlling system 800 may output a specific voltage for the 2D scanning galvo 200.

In an embodiment of the present disclosure, the controlling system 800 includes a hardware program 810, a controller 820 and a wire 830 (such as a B wire). The hardware program 810 may be implemented by LabVIEW software, which provides a voltage required for the 2D scanning galvo and a pulse voltage for triggering the camera. The controller 820 and the wire 830 transmit a signal from a computer to a corresponding device. In an embodiment, the controller 820 may be a control card or a voltage signal generator.

In addition, in an embodiment of the present disclosure, the super-resolution lattice light field microscopic imaging system may further include for example a reconstruction module 700 (not shown in FIG. 2). The reconstruction module 700 may obtain a set of image stacks of the sample by extracting pixels from the images recorded by the image sensor 600, and reconstruct a 3D structure of the sample based on these image stacks. Each image stack corresponds to a sub-pixel shifted light field. With these image stacks, influences of signals out of a focus plane on the sample may be eliminated, and the 3D structure of the sample is reconstructed.

In an embodiment of the present disclosure, a computational reconstruction process of the reconstruction module 700 may be implemented on a hardware system, such as a common personal computer or a workstation. The computational reconstruction of the sample may be performed using acquired image information.

As compared with other imaging methods, advantages of the super-resolution lattice light field microscopic imaging system according to embodiments of the present disclosure are as follows: the super-resolution lattice light field microscopic imaging system of the present disclosure surpasses a diffractive limit resolution and achieves the super-resolution, which is a significant improvement for a traditional low-resolution light field microscopy; the imaging of the sample may be realized with just several shots, which is attributed to the shift of the 2D scanning galvo. As the shift of the 2D scanning galvo is faster than an axial movement of a translation stage of a microscope, the imaging speed of the super-resolution lattice light field microscopic imaging system of the present disclosure is high. Further, the super-resolution lattice light field microscopic imaging system according to embodiments of the present disclosure is suitable for imaging a living sample.

As an example, a principle of the super-resolution lattice light field microscopic imaging system according to embodiments of the present disclosure may be summarized as follows: generating the SIM pattern illumination on the sample using the laser source and the dichroic mirror, using a high magnification objective of the wide-field microscope, arranging the 2D scanning galvo at a Fourier plane, further transmitting the light beams through the microlens array in the limit resolution, and achieving beams of different angles after the modulation of the microlens array, afterwards, adjusting pixel ranges corresponding to each microlens on the image sensor to make the image sensor to obtain the image at different sub-pixel shifted position in each acquisition, and then using the computational method to eliminate the influence of information out of the focal plane and reconstruct the 3D structure of the sample. The super-resolution lattice light field microscopic imaging system according to embodiments of the present disclosure has a super-resolution and a fast imaging speed.

The super-resolution lattice light field microscopic imaging system according to embodiments of the present closure has a simple structure and low costs. Moreover, with this system, a relatively weak excitation light is required for imaging the fluorescence sample, and the super-resolution which surpasses the diffractive limit resolution is achieved using the SIM pattern illumination.

In summary, the super-resolution lattice light field microscopic imaging system according to embodiments of the present disclosure may acquire 3D data of the sample with the super-resolution and high accuracy. Compared with traditional scanning methods, the super-resolution lattice light field microscopic imaging system combines an optical design and the computational reconstruction, the acquisition time is reduced, and the resolution is improved.

In the super-resolution lattice light field microscopic imaging system according to embodiments of the present disclosure, the 2D scanning galvo is arranged in front of the microlens array to shift sub-pixels of the microlens array, the illuminating system is arranged behind the microlens array to allow the illuminating laser to pass the same microlens array to generate the SIM pattern illumination, and an ordinary computer is incorporated to perform data processing, thereby achieving the super-resolution light field imaging. The super-resolution lattice light field microscopic imaging system according to embodiments of the present disclosure combines the super-resolution of a structured illumination microscopy and the fast 3D imaging of a light field microscope. Moreover, the super-resolution lattice light field microscopic imaging system according to embodiments of the present disclosure has a simple structure, a fast imaging speed and an excellent imaging quality, and is suitable for observing dynamic behaviors and structure of a biological sample.

In the following, a super-resolution lattice light field microscopic imaging method according to embodiments of the present disclosure will be described with reference to FIG. 4.

Figure 4:
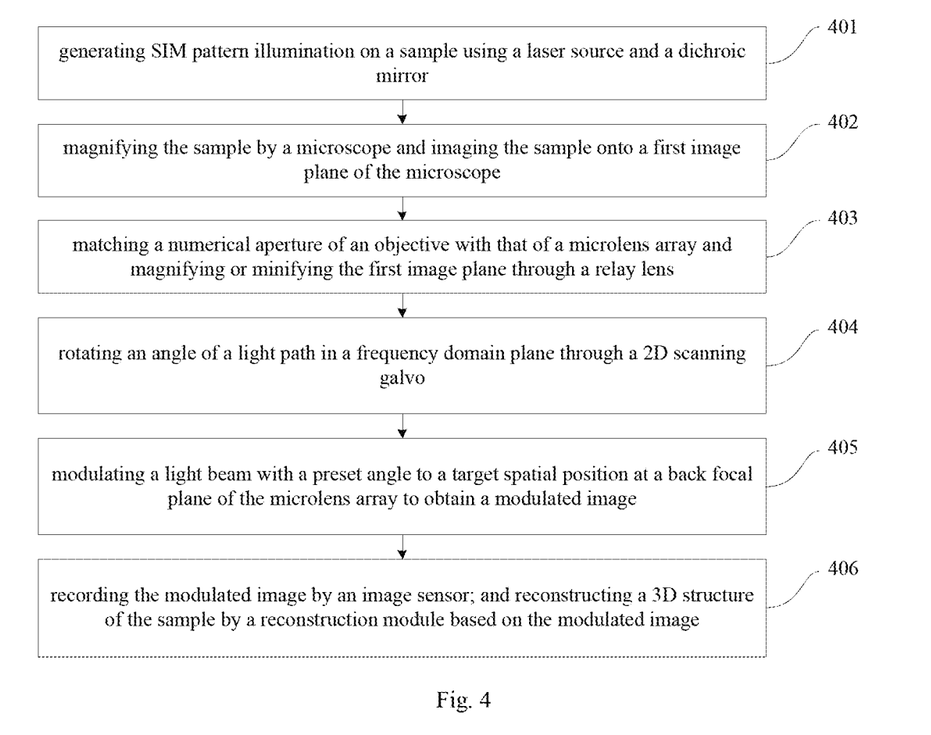
FIG. 4 is a flow chart of a super-resolution lattice light field microscopic imaging method according to an embodiment of the present disclosure.

FIG. 4 is a flow chart of a super-resolution lattice light field microscopic imaging method according to an embodiment of the present disclosure. The scanning light field microscopic imaging method includes the following operations at blocks as illustrated in FIG. 4.

At block 401, SIM pattern illumination is generated on a sample using a laser source and a dichroic mirror.

At block 402, the sample is magnified by a microscope and is imaged onto a first image plane of the microscope.

At block 403, a numerical aperture of an objective is matched with that of a microlens array through a first relay lens and the first image plane is magnified or minified by the first relay lens.

At block 404, an angle of a light path is rotated by a 2D scanning galvo in a frequency domain plane.

At block 405, a light beam with a preset angle is modulated to a target spatial position at a back focal plane of the microlens array to obtain a modulated image.

At block 406, the modulated image is recorded by an image sensor, and a 3D structure of the sample is reconstructed by a reconstruction module based on the modulated image.

It should be illustrated that, the above descriptions and explanations for embodiments of the super-resolution lattice light field microscopic imaging system are also applicable to embodiments of the super-resolution lattice light field microscopic imaging method, and thus will not elaborated herein.

The super-resolution lattice light field microscopic imaging method according to embodiments of the present disclosure is realized by arranging the 2D scanning galvo in front of the microlens array to shift sub-pixels of the microlens array, arranging the illuminating system behind the microlens array to allow the illuminating laser to pass the same microlens array to generate the SIM pattern illumination, and incorporating an ordinary computer to perform data processing. The super-resolution lattice light field microscopic imaging method according to embodiments of the present disclosure combines the super-resolution of a structured illumination microscopy and the fast 3D imaging of a light field microscope, and thus achieves the super-resolution light field imaging. Moreover, the super-resolution lattice light field microscopic imaging method according to embodiments of the present disclosure may be implemented by a simple imaging system, has a fast imaging speed and an excellent imaging quality, and is suitable for observing dynamic behaviors and structure of a biological sample.

In addition, terms such as "first" and "second" are used herein for purposes of description and are not intended to indicate or imply relative importance or significance or to imply the number of indicated technical features. Thus, the feature defined with "first" and "second" may comprise one or more of this feature. In the description of the present invention, a phase of "a plurality of" means two or more than two, such as two or three, unless specified otherwise.

In the present invention, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on", "above", or "on top of" a second feature may include an embodiment in which the first feature is right or obliquely "on", "above", or "on top of" the second feature, or just means that the first feature is at a height higher than that of the second feature: while a first feature "below", "under", or "on bottom of" a second feature may include an embodiment in which the first feature is right or obliquely "below", "under", or "on bottom of" the second feature, or just means that the first feature is at a height lower than that of the second feature.

Reference throughout this specification to "an embodiment", "some embodiments", "one embodiment", "another example", "an example", "a specific example", or "some examples", means that a particular feature, structure, material, or characteristic described in connection with the embodiment or example is included in at least one embodiment or example of the present disclosure. Thus, the appearances of the phrases such as "in some embodiments", "in one embodiment", "in an embodiment", "in another example", "in an example", "in a specific example", or "in some examples", in various places throughout this specification are not necessarily referring to the same embodiment or example of the present disclosure. Furthermore, the particular features, structures, materials, or characteristics may be combined in any suitable manner in one or more embodiments or examples. In addition, in the absence of contradiction, those skilled in the art can combine the different embodiments or examples described in this specification, or combine the features of different embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A super-resolution lattice light field microscopic imaging system, comprising:
   a microscope, comprising an objective and a tube lens, and configured to magnify a sample and to image the sample onto a first image plane of the microscope;
   a first relay lens, configured to match a numerical aperture of the objective with that of a microlens array and to magnify or minify the first image plane;
   a 2D scanning galvo, disposed in a frequency domain plane of the first relay lens, and configured to rotate an angle of a light path in the frequency domain plane;
   an illuminating system, configured to provide uniform illumination on the microlens array to generate SIM pattern illumination;
   the microlens array, configured to modulate a light beam with a preset angle to a target spatial position at a back focal plane of the microlens array to obtain a modulated image;
   an image sensor, disposed at a second image plane of an imaging camera lens and coupled with the microlens array through the imaging camera lens, and configured to record the modulated image; and
   a reconstruction module, configured to acquire the modulated image from the image sensor and reconstruct a 3D structure of the sample based on the modulated image,
   wherein the illuminating system comprises:
   a laser source, disposed outside the microscope, and configured to provide stable and uniform illumination;
   a laser filter, configured to eliminate interference from a stray light; and
   a dichroic mirror, disposed between the microlens array and the image sensor, configured to distinguish an illumination beam from an imaging beam and direct the illumination beam onto the microlens array to generate the SIM pattern illumination.

2. The super-resolution lattice light field microscopic imaging system according to claim 1, wherein the tube lens is configured to match and correct a magnification of the objective.

3. The super-resolution lattice light field microscopic imaging system according to claim 1, wherein the 2D scanning galvo comprises an X-direction scanning galvo and a Y-direction scanning galvo, with the frequency domain plane as a coordinate system.

4. The super-resolution lattice light field microscopic imaging system according to claim 3, wherein the 2D scanning galvo is further configured to rotate a light beam along an x-axis direction through the X-direction scanning galvo and rotate a light beam along a y-axis direction through the Y-direction scanning galvo.

5. The super-resolution lattice light field microscopic imaging system according to claim 1, wherein the first relay lens comprises a first lens and a second lens, when the first image plane is located at a front focal plane of the first lens, the magnified or minified first image plane is located at a back focal plane of the second lens.

6. The super-resolution lattice light field microscopic imaging system according to claim 1, wherein a magnification or minification of the first relay lens is determined by a ratio of a focal length of the first lens to a focal length of the second lens.

7. The super-resolution lattice light field microscopic imaging system according to claim 1, wherein the image sensor is selected from a Scientific Complementary Metal-Oxide-Semiconductor Transistor SCMOS monochrome sensor or Charge Coupled Device CCD, or a Complementary Metal-Oxide-Semiconductor Transistor CMOS.

8. The super-resolution lattice light field microscopic imaging system according to claim 1, further comprising:
   a controlling system, configured to simultaneously trigger the 2D scanning galvo and the image sensor.

9. The super-resolution lattice light field microscopic imaging system according to claim 8, wherein the controlling system comprises
   a controller; and
   a hardware program, configured to provide a voltage required for the 2D scanning galvo and a pulse voltage for triggering the camera.

10. The super-resolution lattice light field microscopic imaging system according to claim 9, wherein the controller is a control card or a voltage signal generator.

11. The super-resolution lattice light field microscopic imaging system according to claim 1, further comprising:
    a second relay lens between the illuminating system and the image sensor,
    wherein the image sensor is disposed at an image plane of the second relay lens and configured to record the modulated image.

12. A super-resolution lattice light field microscopic imaging method, comprising:
    generating SIM pattern illumination on a sample using an illuminating system;
    magnifying the sample by a microscope and imaging the sample onto a first image plane of the microscope;
    matching a numerical aperture of an objective with that of a microlens array and magnifying or minifying the first image plane through a first relay lens;
    rotating an angle of a light path in a frequency domain plane through a 2D scanning galvo;
    modulating a light beam with a preset angle to a target spatial position at a back focal plane of the microlens array to obtain a modulated image;
    recording the modulated image by an image sensor; and
    reconstructing a 3D structure of the sample by a reconstruction module based on the modulated image,
    wherein the illuminating system comprises:
    a laser source, disposed outside the microscope, and configured to provide stable and uniform illumination;
    a laser filter, configured to eliminate interference from a stray light; and
    a dichroic mirror, disposed between the microlens array and the image sensor, configured to distinguish an illumination beam from an imaging beam and direct the illumination beam onto the microlens array to generate the SIM pattern illumination.

13. The super-resolution lattice light field microscopic imaging method according to claim 12, wherein rotating an angle of a light path in a frequency domain plane through a 2D scanning galvo comprises:
    rotating a light beam along an x-axis direction through an X-direction scanning galvo and rotating a light beam along a y-axis direction through a Y-direction scanning galvo.

14. The super-resolution lattice light field microscopic imaging method according to claim 12, further comprising:
    controlling simultaneous trigger of the 2D scanning galvo and the image sensor.

15. A super-resolution lattice light field microscopic imaging system, comprising:
    a microscope, comprising an objective and a tube lens, and configured to magnify a sample and to image the sample onto a first image plane of the microscope, wherein the microscope is selected from a wide-field microscope or and a wide-field fluorescence microscope;

a first relay lens, configured to match a numerical aperture of the objective with that of a microlens array and to magnify or minify the first image plane;

a 2D scanning galvo, disposed in a frequency domain plane of the first relay lens, and configured to rotate an angle of a light path in the frequency domain plane;

an illuminating system, configured to provide uniform illumination on the microlens array to generate SIM pattern illumination;

the microlens array, configured to modulate a light beam with a preset angle to a target spatial position at a back focal plane of the microlens array to obtain a modulated image;

an image sensor, disposed at a second image plane of an imaging camera lens and coupled with the microlens array through the imaging camera lens, and configured to record the modulated image; and a reconstruction module, configured to acquire the modulated image from the image sensor and reconstruct a 3D structure of the sample based on the modulated image.

16. The super-resolution lattice light field microscopic imaging system according to claim 15, wherein the tube lens is configured to match and correct a magnification of the objective.

17. The super-resolution lattice light field microscopic imaging system according to claim 15, wherein the 2D scanning galvo comprises an X-direction scanning galvo and a Y-direction scanning galvo, with the frequency domain plane as a coordinate system.

18. The super-resolution lattice light field microscopic imaging system according to claim 17, wherein the 2D scanning galvo is further configured to rotate a light beam along an x-axis direction through the X-direction scanning galvo and rotate a light beam along a y-axis direction through the Y-direction scanning galvo.

19. The super-resolution lattice light field microscopic imaging system according to claim 15, wherein the first relay lens comprises a first lens and a second lens, when the first image plane is located at a front focal plane of the first lens, the magnified or minified first image plane is located at a back focal plane of the second lens.

20. The super-resolution lattice light field microscopic imaging system according to claim 15, wherein a magnification or minification of the first relay lens is determined by a ratio of a focal length of the first lens to a focal length of the second lens.

* * * * *